United States Patent
Pie et al.

(10) Patent No.: US 6,631,506 B1
(45) Date of Patent: Oct. 7, 2003

(54) METHOD AND APPARATUS FOR IDENTIFYING SWITCHING RACE CONDITIONS IN A CIRCUIT DESIGN

(75) Inventors: Charles Corey Pie, Fort Collins, CO (US); Timothy Charles Fischer, Berthoud, CO (US); Samuel David Naffziger, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/114,545

(22) Filed: Apr. 2, 2002

(51) Int. Cl.$^7$ .............................................. G06F 17/50
(52) U.S. Cl. ......................................................... 716/4
(58) Field of Search ............................................ 716/4

(56) References Cited

U.S. PATENT DOCUMENTS

| | | | | |
|---|---|---|---|---|
| 4,544,850 A | * | 10/1985 | Tarleton ...................... 327/292 |
| 5,801,955 A | * | 9/1998 | Burgun et al. .................. 716/6 |
| 6,305,003 B1 | | 10/2001 | McBride ....................... 716/12 |
| 6,378,109 B1 | * | 4/2002 | Young et al. .................... 716/4 |
| 6,470,021 B1 | * | 10/2002 | Daines et al. ................ 370/422 |
| 6,536,019 B1 | * | 3/2003 | Ouyang .......................... 716/4 |
| 6,581,191 B1 | * | 6/2003 | Schubert et al. ................. 716/4 |
| 2003/0023941 A1 | * | 1/2003 | Wang et al. ..................... 716/4 |
| 2003/0079191 A1 | * | 4/2003 | Savithri et al. ................. 716/4 |

OTHER PUBLICATIONS

"Synopsys PathMill—Datasheet {2142.001}" [on–line] [retrieved on Mar. 7, 2002] Retrieved From: http://www.synopsys.com/products/analysis/pathmill_ds.html. (2002) p. 1–3.

* cited by examiner

*Primary Examiner*—Matthew Smith
*Assistant Examiner*—Andrea Liu

(57) ABSTRACT

The present invention is directed to a method for evaluating a circuit design to identify potential race conditions including the steps of identifying switching elements in a design, storing control node and switched node pair information for each of the switching elements, identifying stacks of the switching elements; storing information about the stacks of switching elements; identifying parallel connected ones of the switching elements; identifying parallel stacks; and calculating a combined switching current for the parallel switching elements and stacks.

25 Claims, 2 Drawing Sheets

METHOD AND APPARATUS FOR IDENTIFYING SWITCHING RACE CONDITIONS IN A CIRCUIT DESIGN

TECHNICAL FIELD

The present invention generally relates to circuit design and specifically relates to software used to model timing of circuits or the minimum time delay through a static gate.

BACKGROUND

Systems are presently known that use the information provided in netlists to evaluate circuit timing and other related parameters. More specifically, systems are known that perform a timing analysis of circuits using netlist files. Although the operational specifics may vary from system to system, generally such systems operate by identifying certain critical timing paths, then evaluating the circuit to determine whether timing violations may occur through the critical paths. As is known, timing specifications may be provided to such systems by way of a configuration file.

One existing system is marketed under the name PATHMILL®, by Synopsys, Inc. PATHMILL® is a transistor-based analysis tool used to find critical paths and verify timing in semiconductor designs. Using static and mixed-level timing analysis, PATHMILL® processes transistors, gates, and timing models. It also calculates timing delays, performs path searches, and checks timing requirements. PATHMILL® may analyze combinational designs containing gates, and sequential designs containing gates, latches, flip-flops, and clocks. Combinational designs are generally measured through the longest and shortest paths.

While tools such as these may be useful for the design verification process after layout, there are various shortcomings in the PATHMILL® product and other similar static timing analyzer products. For example, there is often a need to identify certain logic gates or particular combinations of logic gates. PATHMILL® may be configured to evaluate a netlist file and identify certain nodes but does not automatically identify certain configurations that may prove troublesome.

SUMMARY OF THE INVENTION

The present invention is directed to a method for evaluating a circuit design to identify potential race conditions including the steps of identifying switching elements in a design; storing switched node pair and control node information for each of the switching elements; identifying stacks of the switching elements; storing information about the stacks of switching elements; identifying parallel connected ones of the switching elements; identifying parallel stacks; and calculating a combined switching current for the parallel switching elements and stacks.

DETAILED DESCRIPTION

The present invention may analyze circuits to determine areas where two or more inputs to a switching structure may cause the output of the structure to switch even faster than a timing tool normally assumes. That is, when two or more switching devices or elements are activated in unison, the effect is to provide a temporary increased current flow at their common outputs compared to sequential activation of the devices. Such switching elements or devices include, but are not limited to, Field Effect Transistors (FETs), Metal Oxide Semiconductor FETs (MOSFETs), Junction FETs (JFETs) and Metal-Semiconductor FETs (MESFETs), diodes, Bipolar Junction Transistors (BJTs including but not limited to Insulated Gate Bipolar Transistors (IGBTs)), static induction transistors, tryistors, and other switching devices and elements. The invention recognizes this effect, identifies configurations of switching elements likely to produce the effect, and analyzes the configurations to identify a parameter, such as a current flow, associated with the configuration under predetermined conditions (e.g., simultaneous activation of the devices.) A set of configuration commands may be generated to simulate the condition and, together with the appropriate net list, may be provided to and used by a static timing analyzer to simulate the overall circuit in which the devices or elements are used.

Figure 1:
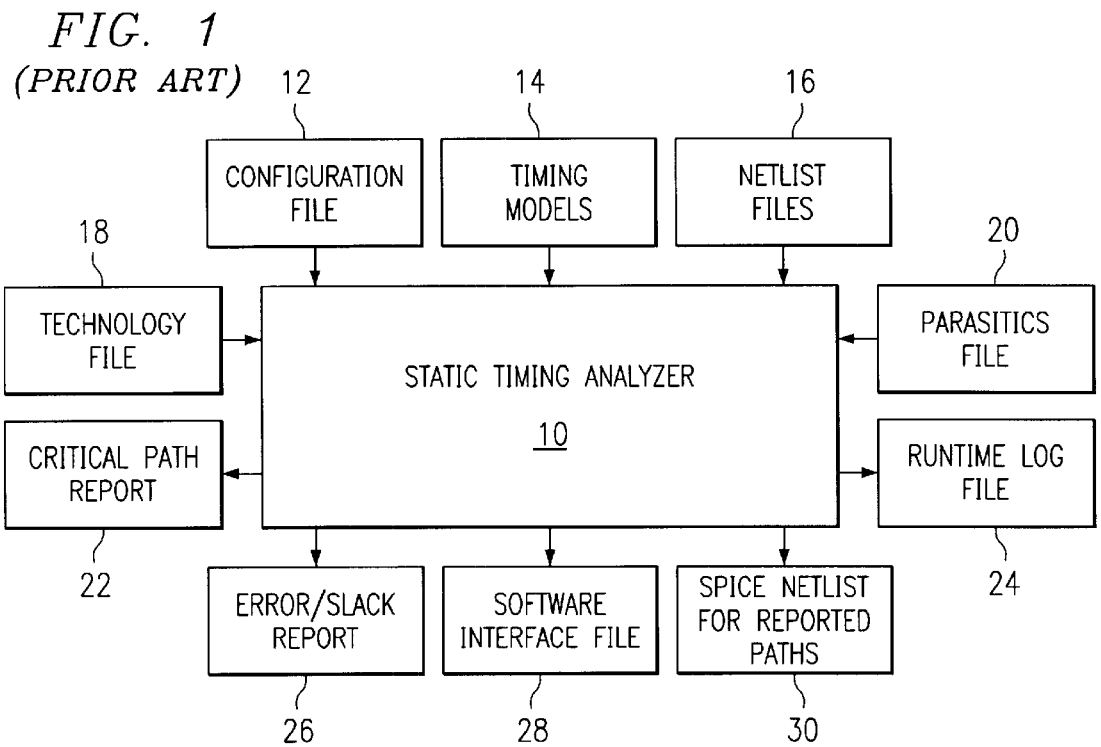
FIG. 1 is a block diagram of a static timing analyzer according to the prior art.

FIG. 1, is a block diagram of a prior art static timing analyzer program that illustrates the basic informational flow in such a system. Specifically, one such system is marketed under the name PATHMILL®. At the center of the diagram is Static Timing Analyzer 10, representing the static timing analyzer program. Surrounding block 10 are a number of other blocks that represent various input and output files and/or information. More particularly, the static timing analyzer program may utilize configuration file 12, a file of timing models 14, one or more netlist files 16, technology file 18, and parasitics file 20, for various input information.

In addition, the static timing analyzer program may generate a number of different output files or other output information, including critical path report 22, runtime log file 24, error report 26, software interface file 28, and SPICE netlist 30. When started, the static timing analyzer program first processes the input netlist file(s) 16, technology file 18, and configuration files 12. The information from these files is subsequently used for performing path analyses. Since the static timing analyzer programs are publicly available and marketed, their function and operation are well known and, therefore, need not be discussed in detail herein.

Conventionally, static timing analyzer 10 is configured to identify the absolute worst-case delays based on any set of initial conditions as defined by configuration file 12. Thus, some configurations or conditions are not calculated as would it be cumbersome and time consuming to account for all possibilities of initial conditions. The invention addresses the case wherein two input signals switch at the same time and in the same direction. For example, if the inputs were both initially zero and both were switched to one, or if the inputs were both one and both were switched to zero, the total current would be different from the current produced if the switching occurred sequentially.

The inventors have recognized that a static timing analyzer is merely configured to find the worst-case delay between an input and the corresponding output. In doing so, it fixes the other input to different values when calculating the delay from the one input to the output, as is generally an acceptable technique for max time analysis, i.e., gives the longest delay. However, the circuit may display a "faster" or smaller delay through the circuit if both of the inputs switch at the same time; a static timing analyzer misses that condition.

When static timing analyzer 10 calculates a total delay from the starting latch through to the subsequent receiving latch at each stage of a circuit, it may incorrectly assume that parallel structures switch at different times. Thus, the total minimum delay calculated may be larger than the possible minimum delay.

If the actual possible minimum delay could be smaller than the delay calculated by the static timing analyzers, then there may be a race condition. Such a race condition occurs when the delay is too small. To avoid the race, a fixed amount of delay must be provided between any given pairs of latches. If the delay is below some threshold value, the resultant race condition may cause the circuitry to improperly function. Thus, the invention includes a method to analyze the circuitry and to identify opportunities where, if two (or more) of the inputs switch at the same time, the coincident signal would likely result in a noticeable difference in the delay and would make switching substantially faster. Such opportunities are identified and quantified. A method according to the invention identifies and quantifies which inputs could be going faster and provides configuration commands to the static timing analyzer so that the circuit is analyzed appropriately. When calculating the minimum delay of a circuit, the configuration file provided to the static timing analyzer must specify that multiple inputs are switching at the same time.

The logic between latches is broken down into gates. Thus, a path from an output of one latch to the input of the next latch includes the delay through all the intervening gates along the path. Typically, a gate is made up of one or more switching elements that are responsive to a control signal applied to a control node of the switching element to selectively complete and interrupt an electrical path or connection between a pair of switched nodes (i.e., a "switched node pair") of the switching element. In the present example, the switching element may take the form of a FET although other types and forms of switching elements (or devices) including but not limited to, BJTs and diodes, may be used and analyzed. In the case of a FET implementation of such logic gates, the FETs act like little switches responsive to a gate control signal to turn the FET on and off. Different logic structures using switching elements such as FET switches occasionally have both (or multiple) switching elements turn on at the same time so as to switch the output faster than it was designed if only one of the switches operated; these configurations may be identified.

In particular, the net list is searched to identify switches that have different gate control signal sources but have the same source and drain (or top and bottom) connections. If both switching elements turn on at the same instant (or within some propagation time prior to the output signal from one of the switching elements stabilizing), the multiple signal sourcing by the action of the pair (or triplet, etc.) of switching elements (e.g., FETs) act to enhance the signal so as to cause a driven stage to switch faster. That is, the current that is conducted through the switching elements will be initially twice as large if there are two switching elements switching at the same time, and it will be three times as large if there are three switching elements switching at the same time, and so on. Therefore, an initial step identifies switching elements (e.g., FETs) having different signals applied to their control nodes (e.g., gates in the case of FETs), but the same switched nodes (e.g., source and drain) connections.

In the present example of FET-based logic, the method identifies the node names that are on the gate source and the drain of each of these FETs in the circuits. If the sources and drains are the same and the gates are connected to different inputs, then the combination is identified such that, if both of the gates may be switched at the same time and the static timing analyzer would otherwise miss analyzing the combination, the configuration is flagged. In effect, the static timing analyzer, is configured so that, when it goes through, the circuit, it assumes that those gates will actually cause a faster transition then they would otherwise.

Figure 2:
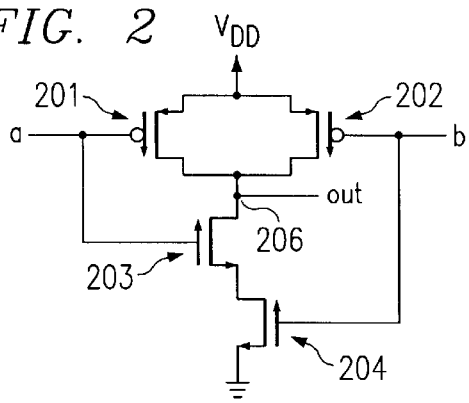
FIG. 2 is a schematic diagram of a two-input NAND gate that can be analyzed using the present invention.

FIG. 2 is a schematic diagram of a two-input NAND gate having an output 206, an input signal "a" applied to "p" type FET 201 and "N" type FET 203, and an input signal "b" applied to "P" type FET 202 and "N" type FET 204. The series connection of FETs 203 and 204 require that both be "turned on" in response to signals applied at inputs a and b to pull output terminal 206 "down," while simultaneously interrupting application of $V_{DD}$ to out terminal 206 by "turning off" FETs 201 and 202. Conversely, application of a low logic signal to either terminal a or b (or both) results in the application of $V_{DD}$ to out terminal 206 by FET 201 or 202, respectively (or both) and interruption of the path to ground by "turning off" FET 203 or 204, respectively (or both).

FET 201 and FET 202 are two "P" type FETs operational such that when a low level signal (e.g., <0.5V) is applied to the gate, the PFET "turns on," i.e., provides a low resistance path between source and drain electrodes. (Conversely, an "N" type or "NFET" turns on in response to a high level (e.g., 3.3V) signal applied to its gate terminal and gate structure to allow a current flow from source to drain.) Note that the "P" type FET (i.e., PFET) is depicted with a small circle on its gate indicating an inverted logic, i.e., this being a standard schematic notation. FET 201 and FET 202 have the same "top" (e.g., drain) connected to $V_{DD}$ and the same "bottom" (i.e., sources) connected to out terminal 206. However, the gates of FETs 201 and 202 are connected to b and a, respectively. If both "a" and "b" fall at the same time, both FET 201 and FET 202 will turn on at the same time, causing a current to flow from $V_{DD}$ that will cause out node to transition high from a low state.

Conventionally, static timing analyzer 10 performs the analysis steps of switching "a" and "b" low separately, but it does not perform analysis of both of these switching events at the same time. The invention addresses this deficiency by looking at the three connections on each FET in the design; it looks at the gate (i.e., control node), source, and drain (i.e., the two switched nodes) or the "side," the "top" and the "bottom" of each of the FETs in the design to identify if they have the same top and the same bottom, i.e., the same source and the same drain, but different gates such that there is an opportunity for enhanced switching speed resulting in a potential race condition. Note that the FETs must also be the same type to exhibit this speed-up effect. These potentially problematic configurations of switching elements (e.g., FETs) are logged and maintained as a list of parallel FETs in the design. A set of configuration commands are then created to tell the static timing analyzer to "speed-up" this path even faster (i.e., reduce the propagation delay of switching time) when performing a minimum time analysis. Since the "drive strength" of these FETs is double, the current will be doubled of what it would be if it were just one FET, thereby decreasing a switching delay of a subsequent latch.

Figure 3:
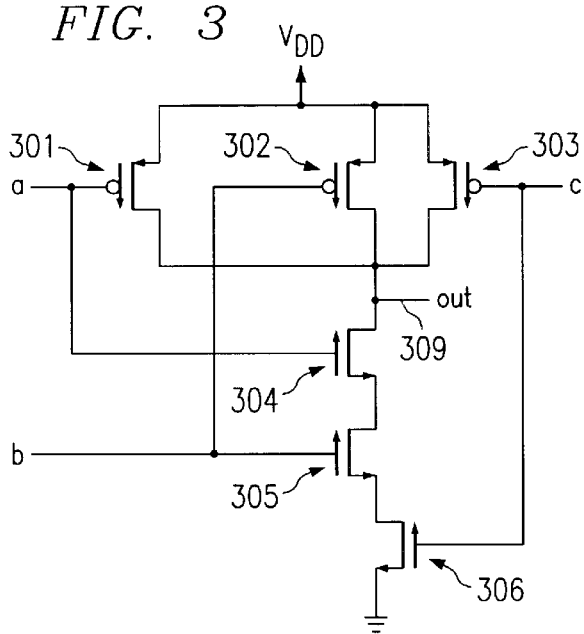
FIG. 3 is a schematic diagram of a three-input NAND gate that can be analyzed using the present invention.

FIG. 3 is a schematic diagram of three-input NAND gate. FETs 301, 302 and 303 are responsive to signals at inputs a, b and c, respectively, to apply $V_{DD}$ to out terminal 309 when any of the signals are a logic low, while the series connection of FETs 304, 305 and 306 interrupt a path to ground "pulling down" out terminal 309 when any (or all) of the signals are a logic high.

As shown, FETs 301, 302, and 303 are connected in parallel. Thus, all three of these FET-type switching elements may turn on at the same time so that there would be three times the current at output 309 compared to the current output when only one of the FETs is turned on, assuming that the FETs are all the same size. The present method adds up the total switching current of the individual FETs that are identified to be in parallel and generates configuration commands to the static timing analyzer allotting the switching current of this-total amount for each of the FETs. Upon identification of the parallelism in the configuration of those FETs, the method has the static timing analyzer treat that path as if there is increased current at output 309.

Figure 4:
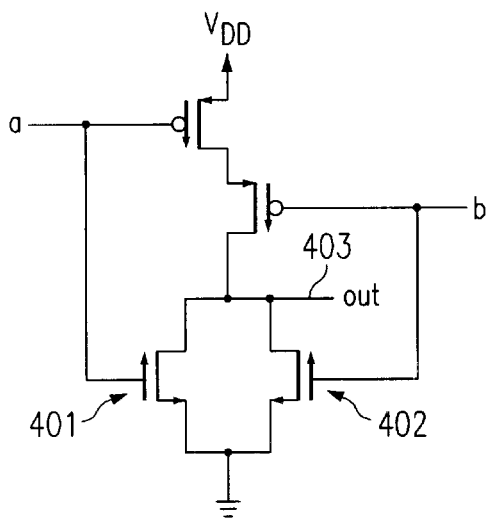
FIG. 4 is a schematic diagram of a two-input NOR gate that can be analyzed using the present invention.

FIG. 4 is a two-input NOR circuit including parallel NFETs 401 and 402. When the respective inputs (a and b) rise, the NFETs turn "on." So if a and b both rise at the same time, the signal at output 403 will be "pulled down" much faster than if just a switched and b stayed the same (or vice versa). This situation is addressed by the present method which identifies these two FETs in parallel because, as before, they have the same bottom node (ground), the same top node (output 406) and different gate nodes (a and b). After identifying parallel NFETs 401 and 402 using the present invention, the static timing analyzer can compensate for the possibility that the current may be increased if NFETs 401 and 402 are switched at the same time.

Figure 5:
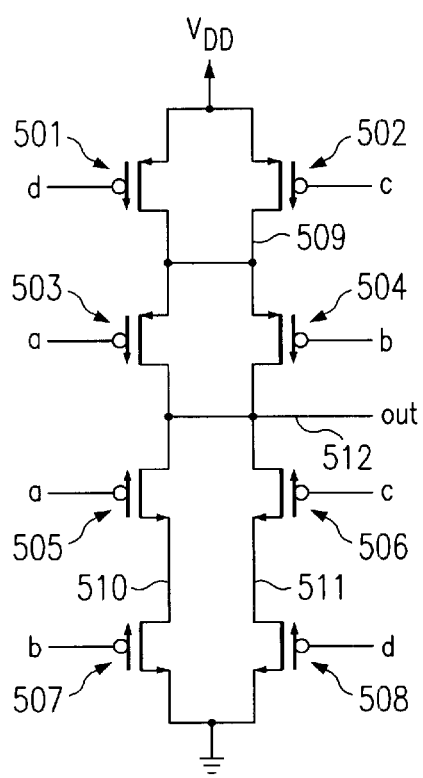
FIG. 5 is a schematic diagram of a to AND/OR logic circuit that can be analyzed using the present invention.

A somewhat more complex structure is shown in FIG. 5. This gate array provides a complex AND/OR structure implementing the Boolean equation: Out=NOT((a AND b) or (c AND d)). FET 501 and 502 are in parallel, i.e., their common top node is $V_{DD}$, their common bottom node is 509, and the gates are "c" and "d". If the signals applied to c and d switch at the same time, node 509 will be pulled up faster than if just "c" or "d" were switched alone. Further, if "a" or "b" are low at the same time, output 512 will be pulled up with twice as much current as it normally would if only one of FET switched. In this example, the static timing analyzer is configured to calculate the delay from "c" or "d" to output 512 by performing the calculation using double the total current that would be produced by individual FETs.

In the present example, there are several pairs of parallelism. That is, not only are 501 and 502 parallel pairs, but so are FETs 503 and 504. Further, there is a complex stacked arrangement in parallel at the "bottom" of the circuit as depicted in the schematic diagram. That is, the method not only addresses individual FETs in parallel, but also stacks (i.e., series connections) of FETs in parallel. Thus, FETs 505 and 507 form one stack connected to node 510. This is a two-high stack formed by two serially connected NFETs (or PFETs). If there are two NFETs that are in a stack that have the same top and bottom as another two-high stack of NFETs (or PFETs), then this configuration is referred to as stacks in parallel. FETs 506 and 508 are also in a stack configuration and connected to node 511 in the middle. FETs 506 and 508 likewise form a two-high stack, the top of that stack connected to output 512 and the bottom of that stack connected to ground. Because these stacks are both two-high and have the same types of FETs and they have the same top and the same bottom, then we consider those in parallel. All the FETs in the present example are NFETs, although the invention is equally applicable to a combination of PFETs and other switching devices. Note that if "b" and "d" are both high and an analysis is performed of the path from "a" to "out", and "a" and "c" switch on at the same time, the increased current produced will make a signal at output 512 fall much faster than when just one stack is switched on. The calculation for the stacks will have a net result as if FET 505 and 506 were in parallel. Thus, not only are FETs 505 and 506 analyzed as a pair, but FETs 507 and 508 are treated as a pair, their total current calculates as if those two pair were in parallel.

Figure 6:
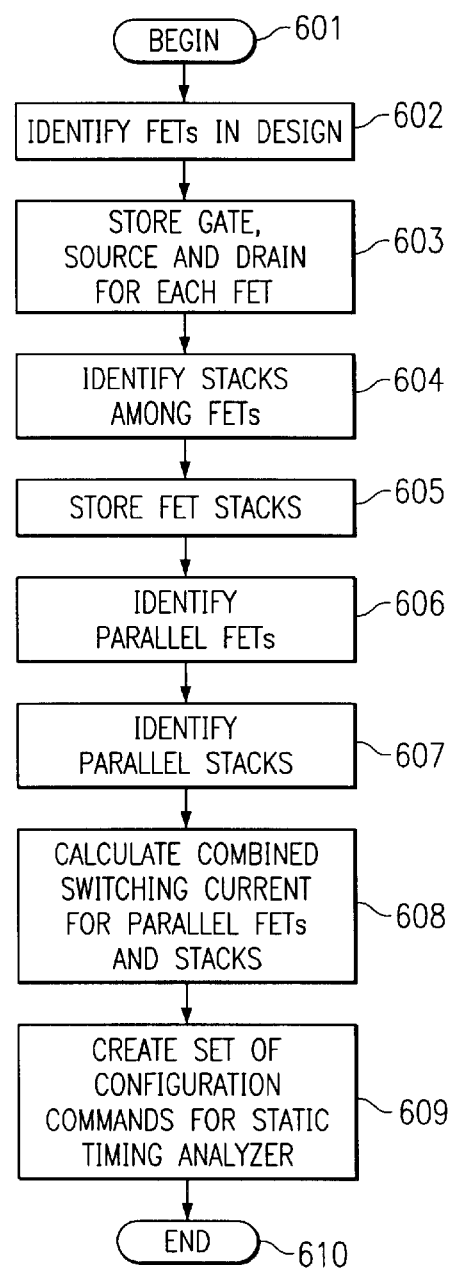
FIG. 6 is a flow diagram of a method for identifying parallel structures creating race conditions in a circuit according to an embodiment of the invention.

FIG. 6 describes the overall flow of a software routine in accordance with an embodiment of the invention. Although the method is presented in terms of FETs, it is equally applicable to other types and forms of switching elements as previously described. Beginning at 601, the process moves to step 602 where all the switching elements (e.g., FETs) in the design are identified, i.e., the design is read by the software into memory. The design may be represented, for example, by a netlist file. A table is then generated at step 603 that lists the control and controlled or switched nodes (e.g., gate, source, and drain) for each switching element in the design. Stacks of FETs are identified in step 604. This is done by finding two gates of the same type where one of them has the same source as the drain of another FET so that they look like a stack. The stacks may be any number of switching elements or FETs tall, e.g., two tall, three tall, etc. When identified, the stacks are designated by how tall they are (i.e., how many FETs are in them), what are the gates, and to what the top and the bottom of the stack is connected. So then, in step 605, the stack information is stored in a table similar to the table used for the gates in step 602. At step 606, parallel sets are identified by comparing every FET in the design to every other FET. One way to perform the comparison is to represent all FETs in a hash based on their source and drain. The hash will distribute the FET listings so as to identify all the FETs that have the same source and drain. Each of the FETs that have the same source and drain are examined, and FETs that have different gates are identified to provide a list of parallel FETs. In step 607, a similar process is performed with the stacks in that stacks that have the same top, bottom and the same type of FETs in them, and the same number of FETs are identified. Again this list (or hash if implemented) of stacked FETs is traversed to find those stacks in which the FETs have gates that are different from one another. If the step identifies stacks that have the same number of FETs in each other, the same type of FETs, the same top and the same bottom, then those stacks are designated as being in parallel and stored as such. In step 608, all of the parallelisms that were stored in steps 606 and 607 are retrieved and the combined current of the parallel configuration of FETs and stacks is calculated. The appropriate configuration commands are then provided to the static timing analysis tool at step 609 to cause it to model the circuit or subcurrent based on the increased currents that result from parallel and/or stacked FETs. The routine ending at 610.

The configuration command to accommodate the increased current may be implemented in different ways. For example, a current property of each the transistors may be altered to reflect the total current through the parallelism so that when one of the FETs (or other type of switching element) switches, that FET is represented as having more current going through it. For example, an FET in a parallel combination may represent an increased current source value. Alternatively, the parallel grouping of FETs may be defined to switch at the same time. In either case, the current calculations are reflected as configuration commands that work with a static timing analyzer so that, when the static timing analysis is run, the analyzer will calculate the decreased delay (i.e., faster switching time) through the circuit.

Note that characteristics of that FET may be different than the standard characteristics so that when the FET switches, it is treated as if it has the combined current going through it instead of just the current for that one FET. For example, referring to FIG. 2, if we assume that FET 201 and FET 202 are the same size as one another, then they have the same normal switching current. So the static timing analyzer is configured to cause FET 201 to have two times the standard current than it would normally have. That way, when the analyzer calculates the current over the path from "b" to out 206, out 206 would switch as if both FET 201 and FET 202 were on because it has twice the switching current.

What is claimed is:

1. A method for evaluating a circuit design to identify potential race conditions comprising the steps of:
   identifying switching elements in the design;
   storing control node and switched node pair information for each of said switching elements;
   identifying stacks of said switching elements;
   storing information about said stacks of switching elements;
   identifying parallel connected ones of said switching elements;
   identifying parallel stacks; and
   calculating a combined switching current for said parallel switching elements and stacks.

2. The method according to claim 1 further comprising:
   creating a set of configuration commands.

3. The method according to claim 2 further comprising:
   performing a static timing analysis of a circuit including said switching elements using said configuration commands.

4. The method according to claim 3 further comprising:
   storing said information for each of said switching elements in a hash table.

5. The method according to claim 1 wherein said step of identifying stacks of said switching elements comprises:
   identifying ones of said switching elements having common switched node pair connections and different control node connections.

6. The method according to claim 1 wherein said step of identifying comprises:
   the steps of identifying FETs having common source and drain connections and different gate connections.

7. The method according to claim 1 wherein said step of identifying stacks of said switching elements comprises:
   identifying a particular conductivity type of ones of said switching elements connected in series.

8. The method according to claim 7 wherein said series connection of switching elements comprises:
   switching elements having respective control nodes connected to different switching signal sources.

9. The method according to claim 1 wherein said switching elements are included within the group consisting of diodes, field effect transistors, and bipolar junction transistors.

10. A circuit analysis program stored in a computer readable media, said analysis program comprising:
    logic for identifying switching elements in a design;
    logic for storing control node and switched node pair information for each of said switching elements;
    logic for identifying stacks of said switching elements;
    logic for storing information about said stacks of switching elements;
    logic for identifying parallel connected ones of said switching elements;
    logic for identifying parallel stacks; and
    logic for calculating a combined switching current for said parallel switching elements and stacks.

11. The circuit analysis program according to claim 10 further comprising:
    logic for creating a set of configuration commands.

12. The circuit analysis program according to claim 11 further comprising:
    logic for performing a static timing analysis of a circuit including said switching elements using said configuration commands.

13. The circuit analysis program according to claim 12 further comprising:
    logic for storing said information for each of said switching elements in a hash table.

14. The circuit analysis program according to claim 10 wherein said logic for identifying stacks of said switching elements comprises:
    logic for identifying ones of said switching elements having common switched node pair connection and different control node connections.

15. The circuit analysis program according to claim 14 wherein said logic for identifying stacks of said switching elements comprises:
    logic for identifying FETs having common source and drain connections and different gate connections.

16. The circuit analysis program according to claim 10 wherein logic for identifying stacks of said switching elements comprises:
    logic for identifying a particular conductivity type of ones of said switching elements connected in series.

17. The circuit analysis program according to claim 16 wherein said series connection of switching elements comprises:
    switching elements having respective control nodes connected to different switching signal sources.

18. The circuit analysis program according to claim 10 wherein said switching elements are included within the group consisting of diodes, field effect transistors and bipolar junction transistors.

19. A circuit analyzer comprising:
    means for identifying switching elements in a design;
    means for storing control node and switched node pair information for each of said switching elements;
    means for identifying stacks of said switching elements;
    means for storing information about said stacks of switching elements;
    means for identifying parallel connected ones of said switching elements;
    means for identifying parallel stacks; and
    means for calculating a combined switching current for said parallel switching elements and stacks.

20. The circuit analyzer according to claim 19 further comprising:

means for creating a set of configuration commands.

21. The circuit analyzer according to claim 20 further comprising:

means for performing a static timing analysis of a circuit including said switching elements using said configuration commands.

22. The circuit analyzer according to claim 21 further comprising:

means for storing said information for each of said switching elements in a hash table.

23. The circuit analyzer according to claim 19 wherein said means for identifying stacks of said switching elements comprises:

means for identifying ones of said switching elements having common switched node pair and identifying one of said FETs connections and different gate connections.

24. The circuit analyzer according to claim 19 wherein said means for identifying stacks of said switching elements comprises:

means for identifying a particular conductivity type of ones of said switching elements connected in series.

25. The circuit analyzer according to claim 19 wherein said switching elements are included within the group consisting of diodes, field effect transistors and bipolar junction transistors.

* * * * *